United States Patent
Hirashima et al.

(10) Patent No.: US 6,335,566 B1
(45) Date of Patent: Jan. 1, 2002

(54) SEMICONDUCTOR DEVICE AND AN ELECTRONIC DEVICE

(75) Inventors: Toshinori Hirashima; Takefumi Endo; Kazuo Watanabe, all of Takasaki; Kenji Hanada; Takao Sonobe, both of Komoro, all of (JP)

(73) Assignees: Hitachi, Ltd.; Hitachi ULSI Systems Co., Ltd., both of Tokyo; Hitachi Tohbu Semiconductor, Ltd., Gunma, all of (JP)

( * ) Notice: Subject to any disclaimer, the term of this patent is extended or adjusted under 35 U.S.C. 154(b) by 0 days.

(21) Appl. No.: 09/646,712
(22) PCT Filed: Jun. 15, 2000
(86) PCT No.: PCT/JP00/03907
  § 371 Date: Nov. 17, 2000
  § 102(e) Date: Nov. 17, 2000
(87) PCT Pub. No.: WO00/05437
  PCT Pub. Date: Feb. 3, 2000

(30) Foreign Application Priority Data
  Jun. 17, 1999 (JP) ................................. 11-170570

(51) Int. Cl.$^7$ .................................... H01L 23/02
(52) U.S. Cl. .................... 257/686; 257/777; 257/778; 257/724
(58) Field of Search ..................... 257/686, 685, 257/723, 724, 778, 777, 306, 298

(56) References Cited

U.S. PATENT DOCUMENTS 5,608,262 A * 3/1997 Degani et al.
5,635,767 A   6/1997 Wenzel et al. ............... 257/778
5,646,828 A * 7/1997 Degani et al.
5,808,878 A * 9/1998 Saito et al.
5,869,894 A * 2/1999 Degani et al.
6,150,724 A * 11/2000 Wenzel et al.
6,181,008 B1 * 1/2001 Avery et al.
6,201,302 B1 * 3/2001 Tzu
6,204,562 B1 * 3/2001 Ho et al.

FOREIGN PATENT DOCUMENTS

JP  6-302714   10/1994
JP  9-260537   10/1997

* cited by examiner

Primary Examiner—Sheila V. Clark
(74) Attorney, Agent, or Firm—Miles & Stockbridge P.C.

(57) ABSTRACT

Disclosed herein is a semiconductor device in which a main surface of a semiconductor chip is placed over a first main surface of a wiring board so as to be opposed thereto and which includes a plurality of external terminals provided over a second main surface of the wiring board. The plurality of external terminals have a plurality of signal terminals and a plurality of power terminals. The signal terminals are arranged along the periphery of the wiring board and the power terminals are arranged along the inside of a row of the signal terminals. Chip capacitors are placed over the main surface of the semiconductor chip, which lies inside a row of the power terminals. The plurality of signal terminals and power terminals formed over the main surface of the semiconductor chip are connected to a plurality of wires formed over the wiring board respectively. The wiring board is provided with an opening or recess which extends therethrough. The chip capacitors are located within the opening or recess. Thus, a reduction in switching noise can be achieved.

14 Claims, 15 Drawing Sheets

SEMICONDUCTOR DEVICE AND AN ELECTRONIC DEVICE

TECHNICAL FIELD OF THE INVENTION

The present invention relates to a semiconductor device and an electronic device, and particularly to a semiconductor device in which power decoupling capacitors comprising chip capacitors are built to reduce switching noise, and a radio or wireless communication device with the semiconductor device built therein, such as a portable cellular phone or the like.

BACKGROUND ART

With the speeding-up of a signal processing speed of an electronic device, switching noise offers a problem. Upon the use of a semiconductor device having such a structure as to simultaneously turn on and off a plurality of transistors, power source noise developed due to a power supply variation produced upon switching leads to a malfunction or the like of an electronic device (electronic system) in which the semiconductor device is incorporated. Therefore, a structure has normally been adopted wherein a bypass capacitor for power decoupling is incorporated between a power line and an earth line of an electronic device.

Japanese Published Unexamined Patent Application No. Hei 9(1997)-260537 discloses, for example, a surface-mounting type package wherein chip capacitors are placed over a ceramic substrate to absorb switching noise developed with the speeding-up of a control speed and a signal processing speed of an electronic device.

The ceramic substrate of the package has a solid pattern for power supply and solid patterns for signal wiring and ground as inner layers. The ceramic substrate takes a structure wherein a semiconductor chip is mounted to the surface of the ceramic substrate by using a flip chip structure and chip capacitors are provided on its reverse side or back (on the connecting-surface side of a motherboard).

In the structure wherein the semiconductor chip is mounted to the surface of the wiring board (ceramic substrate) by flip chip bonding and the chip capacitors are attached to the back thereof (the connecting-surface side of the motherboard) as described in the above reference, the inductance and resistance of each wiring portion extending in the direction of thickness of the ceramic substrate increase because the chip capacitors are placed over the back of the ceramic substrate, which is spaced away from electrodes of the semiconductor chip. Therefore, there is a risk of power source noise being incapable of being reduced effectively.

An object of the present invention is to provide a semiconductor device capable of achieving a reduction in switching noise.

Another object of the present invention is to provide an electronic device capable of achieving a reduction in switching noise.

The above, other objects and novel features of the present invention will become apparent from the description of the present specification and the accompanying drawings.

DISCLOSURE OF THE INVENTION

Summaries of typical ones of the inventions disclosed in the present application will be described in brief as follows:

(1) There is provided a semiconductor device in which a main surface of a semiconductor chip is placed over a first main surface of a wiring board so as to be opposed thereto and which includes a plurality of external terminals provided over a second main surface of the wiring board. In the semiconductor device, the plurality of external terminals have a plurality of signal terminals and a plurality of power terminals. The signal terminals are arranged along the periphery of the wiring board and the power terminals are arranged along the inside of a row of the signal terminals. Chip capacitors are placed over the main surface of the semiconductor chip, which lies inside a row of the power terminals. The plurality of signal terminals and power terminals formed over the main surface of the semiconductor chip are connected to a plurality of wires formed over the wiring board respectively. The wiring board is provided with an opening or recess which extends therethrough, and the chip capacitors are located within the opening or recess. Bumps for connecting the electrodes of the chip capacitors and the electrodes of the wiring board, and bumps for connecting the electrodes of the wiring board and the electrodes of the semiconductor chip are simultaneously provided respectively. The electrodes of the semiconductor chip are placed between the signal terminals and the power terminals. A space area, which allows the provision of one or more rows of the signal terminals, is provided between the row of the signal terminals and the row of the power terminals. The chip capacitors are power decoupling capacitors and provided between power terminals and ground terminals formed over the main surface of the semiconductor chip in protruded form. The power decoupling capacitors are provided every predetermined blocks for circuits incorporated into the semiconductor chip.

(2) There is provided an electronic device having wiring board and a semiconductor device connected to electrodes of the wiring board through bumps. The semiconductor device takes the construction of the above means (1). Through holes are defined which are provided with through conductors at portions of the semiconductor device, with which a space area of the wiring board with the semiconductor device attached thereto is faced. Wires drawn for the power terminals are drawn to the reverse side of the wiring board via the through conductors and drawn outside the row of the signal terminals. The semiconductor device constitutes an integrated circuit built in a radio or wireless communication device.

According to the above means (1), (a) since the power decoupling capacitors are directly placed over the main surface of the semiconductor chip, the length of each conductor (wiring) portion lying between each of the capacitors and the semiconductor chip becomes short to thereby allow reductions in resistance and inductance, whereby switching noise can be further reduced.

(b) Since the semiconductor chip having the power decoupling capacitors placed over the main surface thereof is fixed to the wiring board on the main surface side thereof by flip chip bonding, and the wiring board is provided with the opening or recess into which the power decoupling capacitors fixed to the main surface of the semiconductor chip are inserted, a reduction in the thickness of the semiconductor device can be achieved.

According to the above means (2), (a) an electronic device, which provides less switching noise, can be provided owing to the incorporation of the semiconductor device capable of reducing switching noise therein. In particular, a radio or wireless communication device such as a portable cellular phone or the like is capable of providing a more satisfactory call.

BEST MODE FOR CARRYING OUT THE INVENTION

Figure 1:
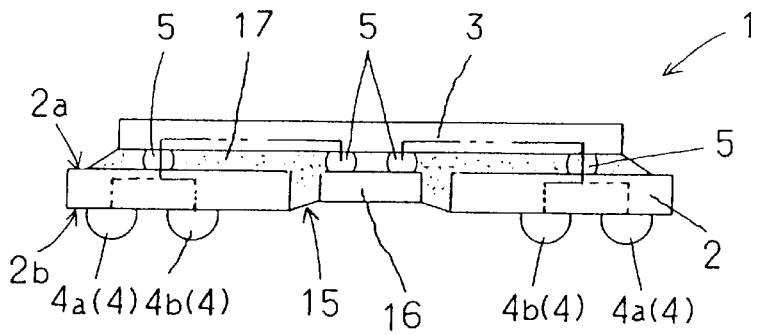
FIG. 1 is a typical cross-sectional view showing a semiconductor device according to one embodiment (embodiment 1) of the present invention.

The best mode for carrying out the invention will hereinafter be described in detail with reference to the accompanying drawings. Components or those each having the same function in all drawings for describing the embodiments of the invention are identified by the same reference numerals and their repetitive description will therefore be omitted. (Embodiment 1) FIGS. 1 through 22 are respectively views related to a semiconductor device showing one embodiment (embodiment 1) of the present invention. FIGS. 1 through 10 are respectively views related to the semiconductor device and respective parts which constitute the semiconductor device. FIGS. 11 through 14 are respectively views related to a portable telephone or portable cellular phone in which the semiconductor device according to the present embodiment 1 is incorporated. FIGS. 15 through 22 are respectively views related to a method of manufacturing semiconductor devices.

In the present embodiment 1, a description will be made of an example in which the present invention is applied to a high-frequency unit analog signal processing IC of a digital cellular type portable cellular telephone used as a radio or wireless communication device.

Figure 2:
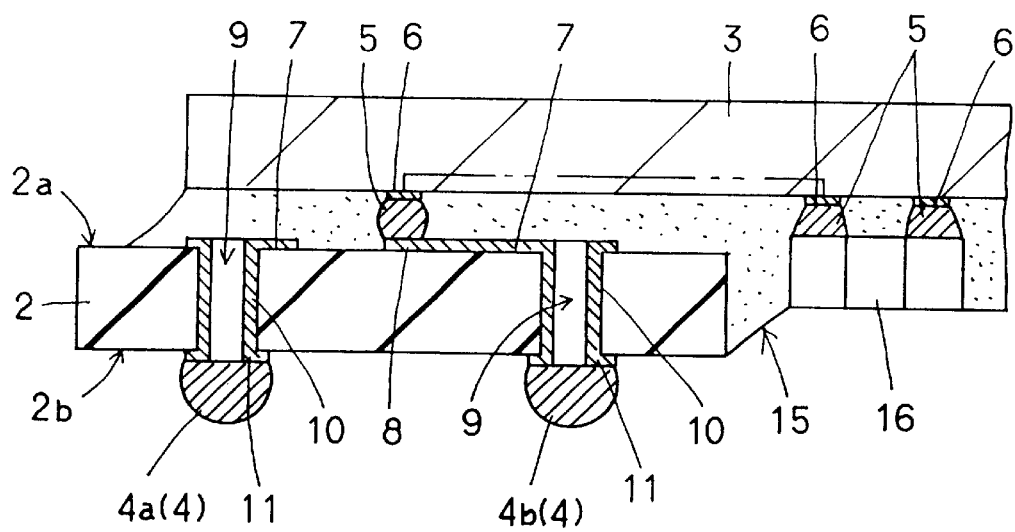
FIG. 2 is an enlarged cross-sectional view of part of the semiconductor device according to the present embodiment 1.
Figure 3:
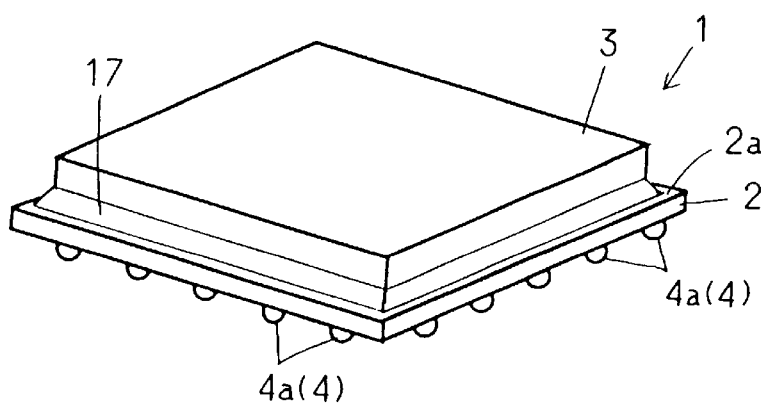
FIG. 3 is a perspective view of the semiconductor device according to the present embodiment 1.

FIG. 1 is a typical cross-sectional view showing a semiconductor device 1 according to the present embodiment 1, which constitutes a high-frequency unit analog signal processing IC, FIG. 2 is a partly enlarged cross-sectional view of the semiconductor device 1, and FIG. 3 is a perspective view of the semiconductor device 1, respectively. As shown in these drawings, the semiconductor device 1 has a structure wherein a semiconductor chip 3 is placed over a first main surface 2a of a wiring board 2 by flip chip bonding and protruding bumps 4 are provided over a second main surface 2b of the wiring board 2.

As described above, bumps 5 for flip chip bonding are provided over a main surface of the semiconductor chip 3.

However, the bumps 5 are formed over their corresponding electrodes 6 provided over the main surface of the semiconductor chip 3.

Figure 9:
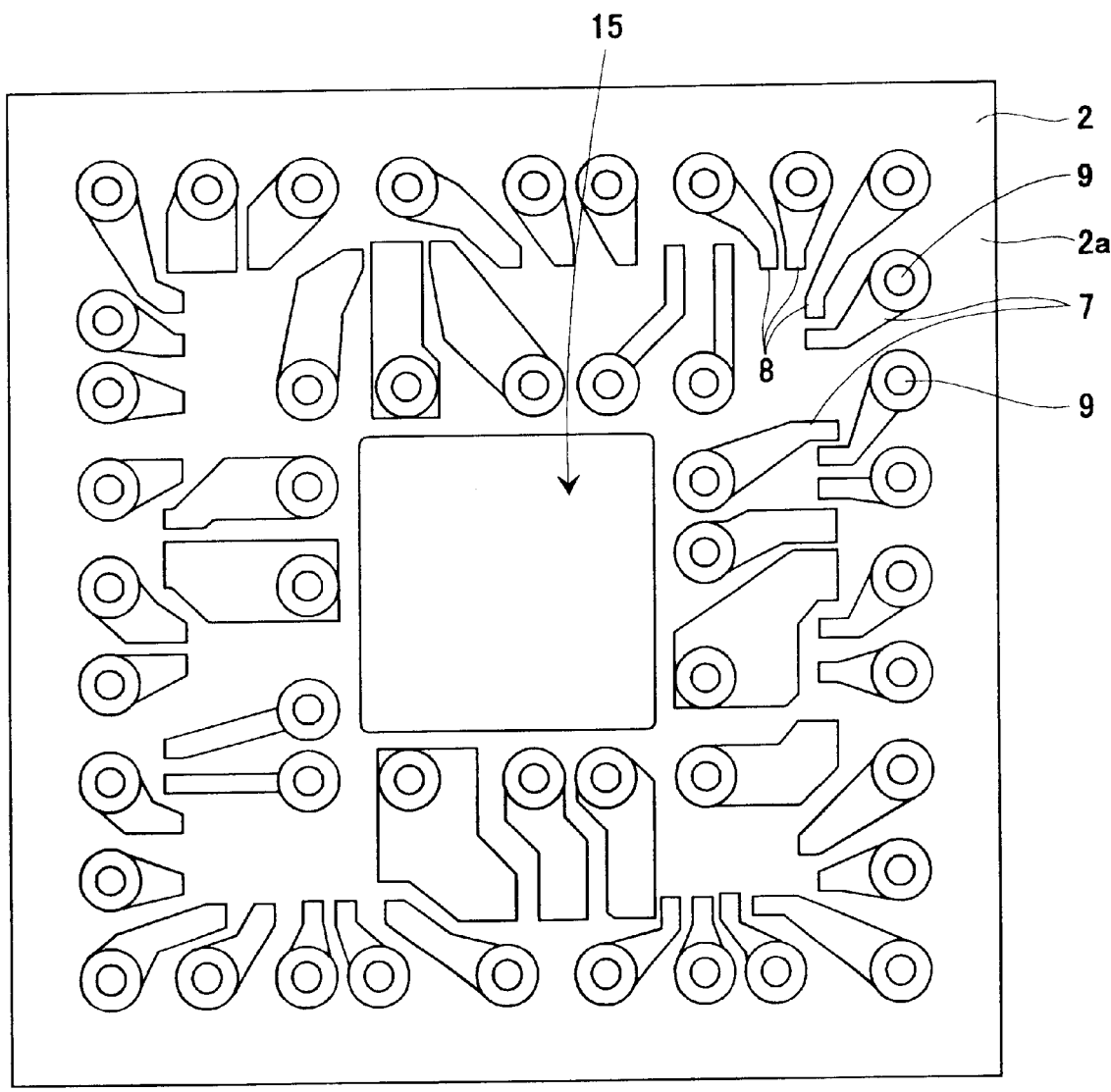
FIG. 9 is a plan view showing a chip on-board surface of the wiring board which constitutes the semiconductor device according to the present embodiment 1.

As shown in FIGS. 2 and 9, wires or interconnections 7 are provided over the first main surface 2a of the wiring board 2 in predetermined patterns. Some of the wires 7 constitute electrode pads 8 by which the bumps 5 are fixed. Further, through holes 9 are defined in the wiring board 2 so as to intersect the wires 7 respectively. Conductors 10 are respectively formed over the surfaces of the through holes 9 by plating or the like. Parts of the second main surface 2b with the through holes 9 defined therein serve as electrodes 11, and the bumps 4 are provided over the electrodes 11, respectively.

Further, an opening 15, which extends through the wiring board 2, is provided in the central portion of the wiring board 2. Capacitors 16, which constitute chip parts respectively, are placed over the main surface of the semiconductor chip 3, which corresponds to a region or area lying within the opening 15. The capacitors 16 are held within the opening 15 and does not protrude from the second main surface 2b of the wiring board 2.

Respective electrode portions of the capacitors 16 are electrically connected to their corresponding bumps 5 formed over the main surface of the semiconductor chip 3 in advance. The bumps 5 are identical in structure to the bumps 5 electrically connected to their corresponding electrode pads 8 of the wiring board 2 and are formed simultaneously upon the formation of the semiconductor chip 3.

Figure 6:
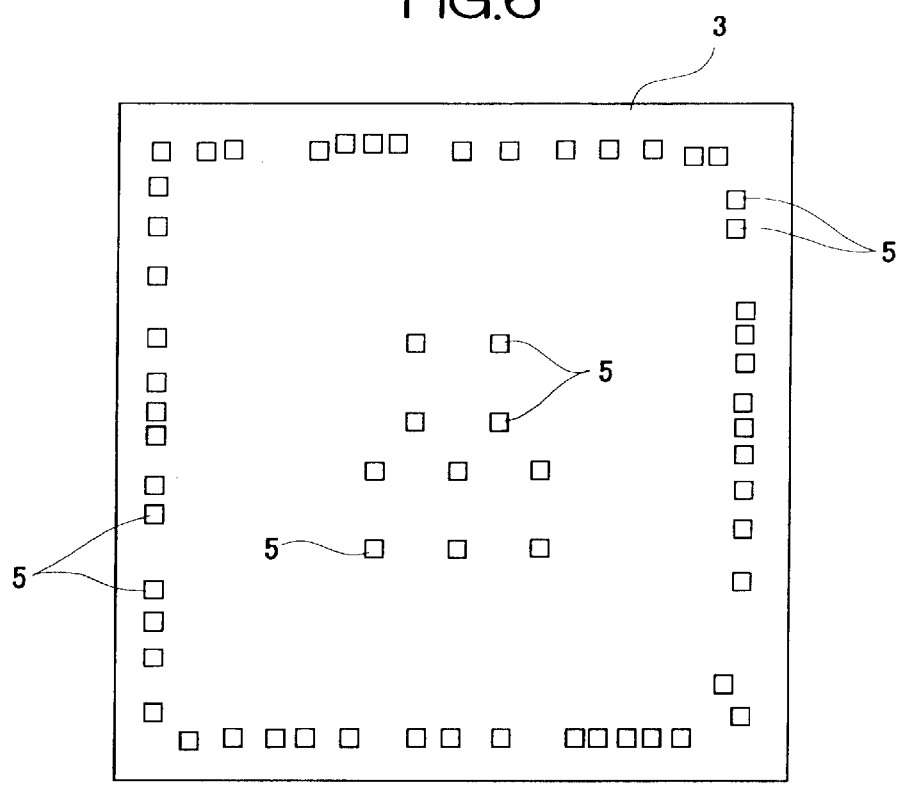
FIG. 6 is a plan view showing a bonding surface of the semiconductor chip which constitutes the semiconductor device according to the present embodiment 1.
Figure 7:
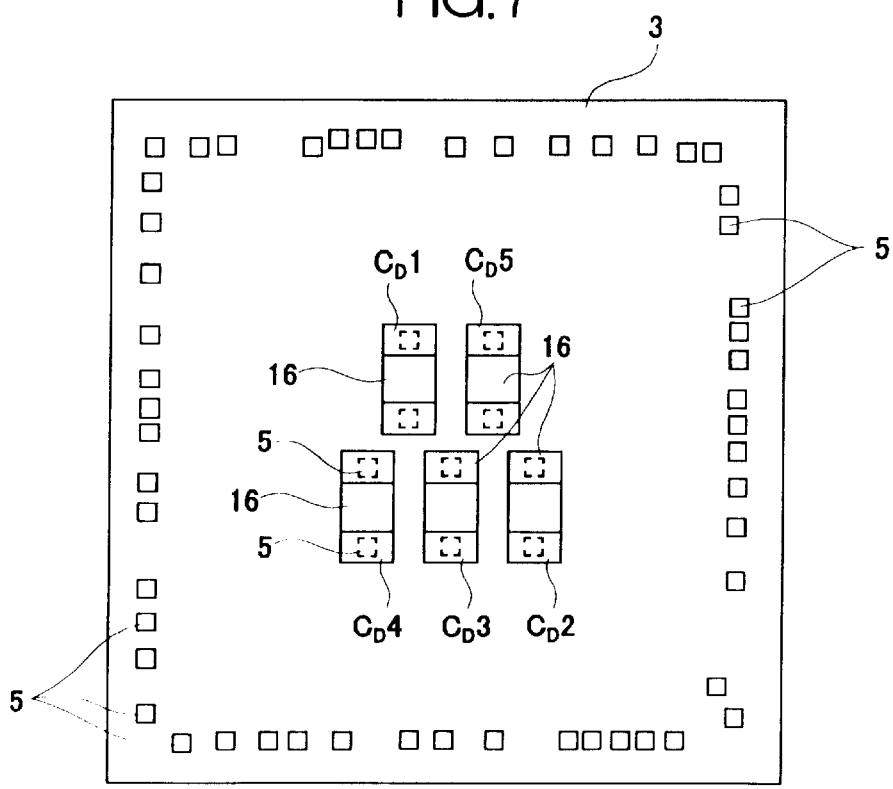
FIG. 7 is a plan view illustrating a state in which the semiconductor chip constituting the semiconductor device according to the present embodiment 1 is equipped with power coupling capacitors.

Namely, FIG. 6 is a view showing the main surface of the semiconductor chip 3. The bumps 5 provided along the periphery of the semiconductor chip 3 are respectively fixed to the electrode pads 8 of the wiring board 2. Further, the bumps 5, which exist in the central portion of the semiconductor chip 3, place the capacitors 16 thereon (see FIG. 2). The electrode portions of the capacitors 16 are fixed to the bumps 5 respectively. FIG. 7 is a view showing the main surface of the semiconductor chip 3 which indicates a state in which the capacitors 16 are placed thereon. The five capacitors 16 are placed on the main surface thereof in the drawing.

The capacitors 16 serve as power decoupling capacitors for reducing switching noise. While only one capacitor 16 is shown in FIG. 1, the five power decoupling capacitors 16 are placed as described above in the present embodiment 1.

A resin (underfill resin) 17 is charged into a clearance or gap between the first main surface 2a of the wiring board 2 and the main surface of the semiconductor chip 3, thereby improving moisture resistance. The underfill resin 17 blocks even the peripheries of the respective capacitors 16. The underfill resin 17 is formed by charging a resin even from the opening 15 side and curing it.

The semiconductor device 1 according to the present embodiment 1 is a so-called chip size package (CSP) type. The wiring board 2 approximates to the semiconductor chip 3 in size and is slightly larger than the semiconductor chip 3 in dimension.

While this is one feature of the present invention, the bumps 5 arranged on the center side of the semiconductor chip 3 are respectively power bumps.

While the five power decoupling capacitors (capacitors) 16 are provided to reduce switching noise developed due to simultaneous switching between a plurality of transistors built in the semiconductor chip 3 in the present embodiment 1, the capacitors 16 are electrically connected to their corresponding power bumps provided on the center side of the semiconductor chip 3.

In the present embodiment 1, interconnections or wires drawn from circuit parts (operating blocks) of the high-frequency unit analog signal processing IC built in the semiconductor device 1 are drawn to the central portion of the semiconductor chip 3 as power bumps [corresponding to high-potential power supply or source wires (Vcc) and low-potential source wires (grounds)]. The electrodes of the capacitors 16 are fixed to these respective pairs of power bumps respectively.

Figure 4:
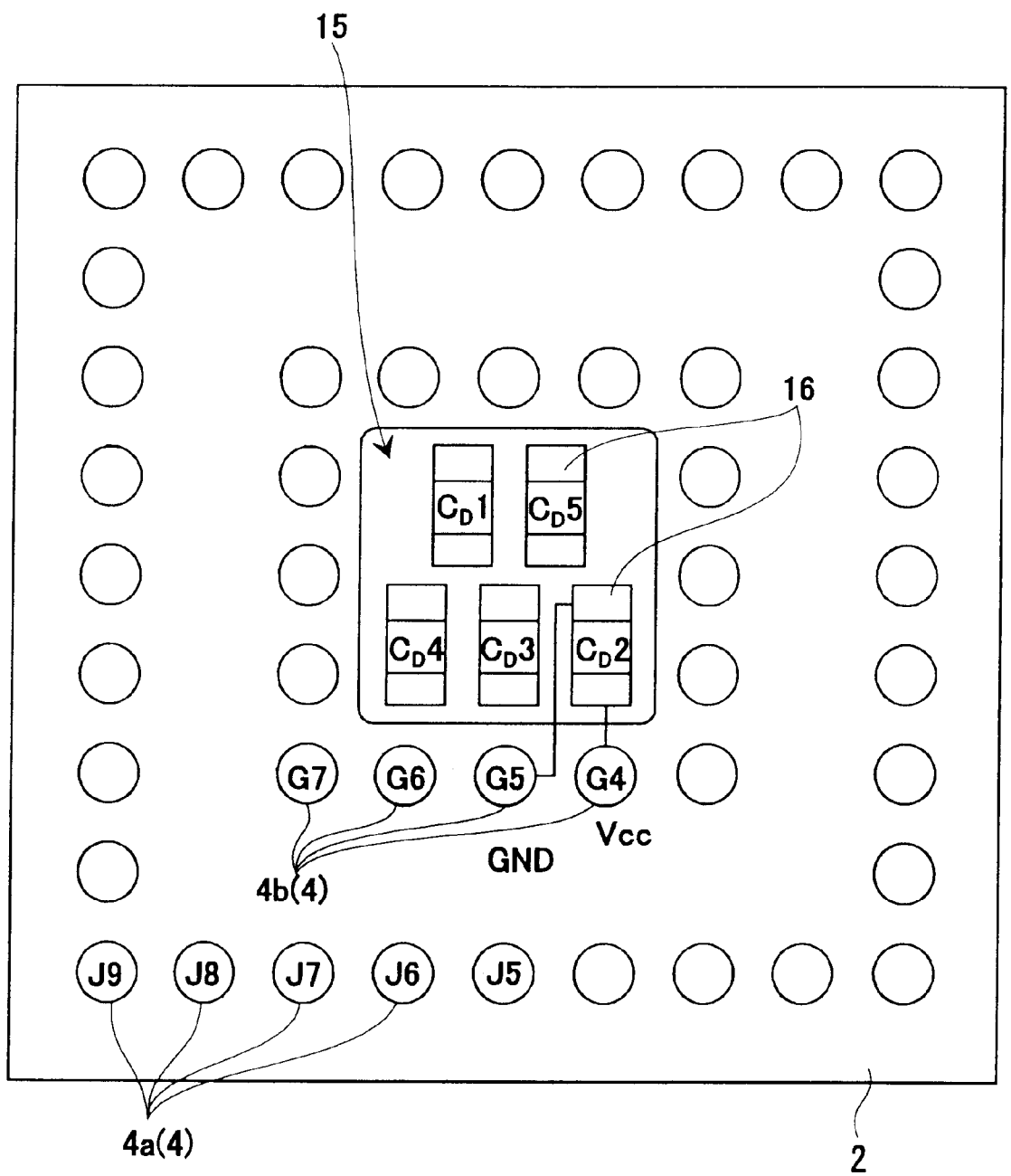
FIG. 4 is a bottom view of the semiconductor device according to the present embodiment 1.

As shown in FIG. 4, the bumps 4 provided over the second main surface 2b of the wiring board 2 comprise signal terminals 4a comprised of bumps arranged along the periphery of the wiring board and power terminals 4b comprised of bumps arranged along the inside of the signal terminals 4a and along the edge of the opening 15. Thus, as shown in FIGS. 1 and 2, the electrodes of the respective capacitors 16 and the power terminals 4b arranged along the edge of the opening 15 are respectively electrically connected to one another.

An advantageous effect is brought about in that since the signal terminals of the high-frequency unit analog signal processing IC are mainly connected to chip parts such as capacitors, coils, etc., wiring lengths of the chip parts, extending from the signal terminals can be shortened by arranging the signal terminals 4a outside a row of the power terminals 4b, and the influence of parasitic elements is minimized because no through holes or the like are used.

Figure 10:
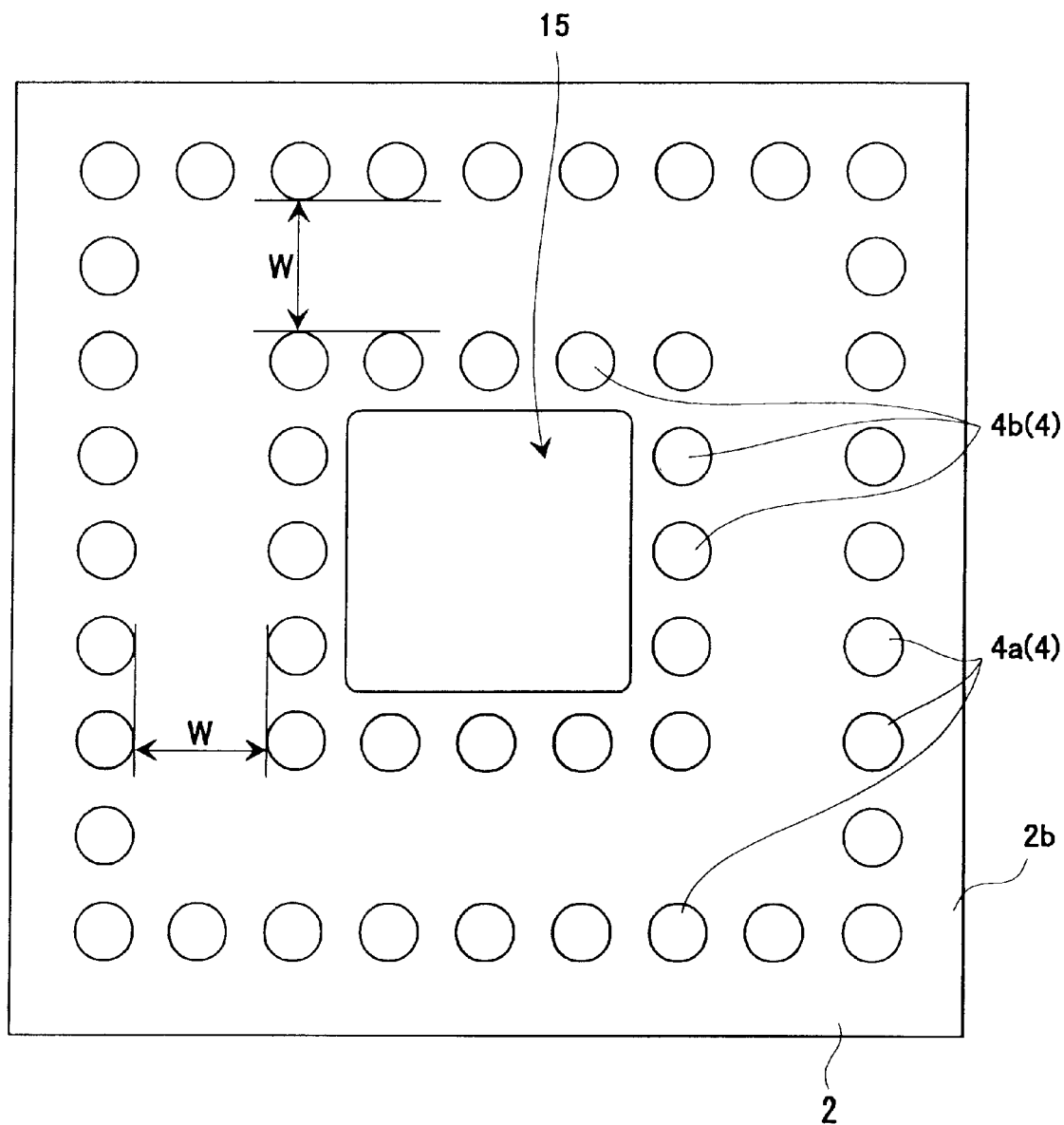
FIG. 10 is a bottom view illustrating a mounting surface of the wiring board which constitutes the semiconductor device according to the present embodiment 1.

A space area W in which the terminals can be provided in one or more rows, is provided between the row of the inner power terminals 4b and the outer signal terminals 4a as shown in FIG. 10. As will be described later, this is because when the pitch of each bump 4 is small, wires or interconnections connected to the inner power terminals 4b cannot be drawn between the outer signal terminals 4a in the wiring board (printed circuit board) on which the semiconductor device 1 is implemented. This is a structure adopted to introduce the wires coupled to the inner power terminals 4b into the rear side of the wiring board through the through holes and draw the wires outside from the outer signal terminals 4a on the rear side of the wiring board.

Figure 5:
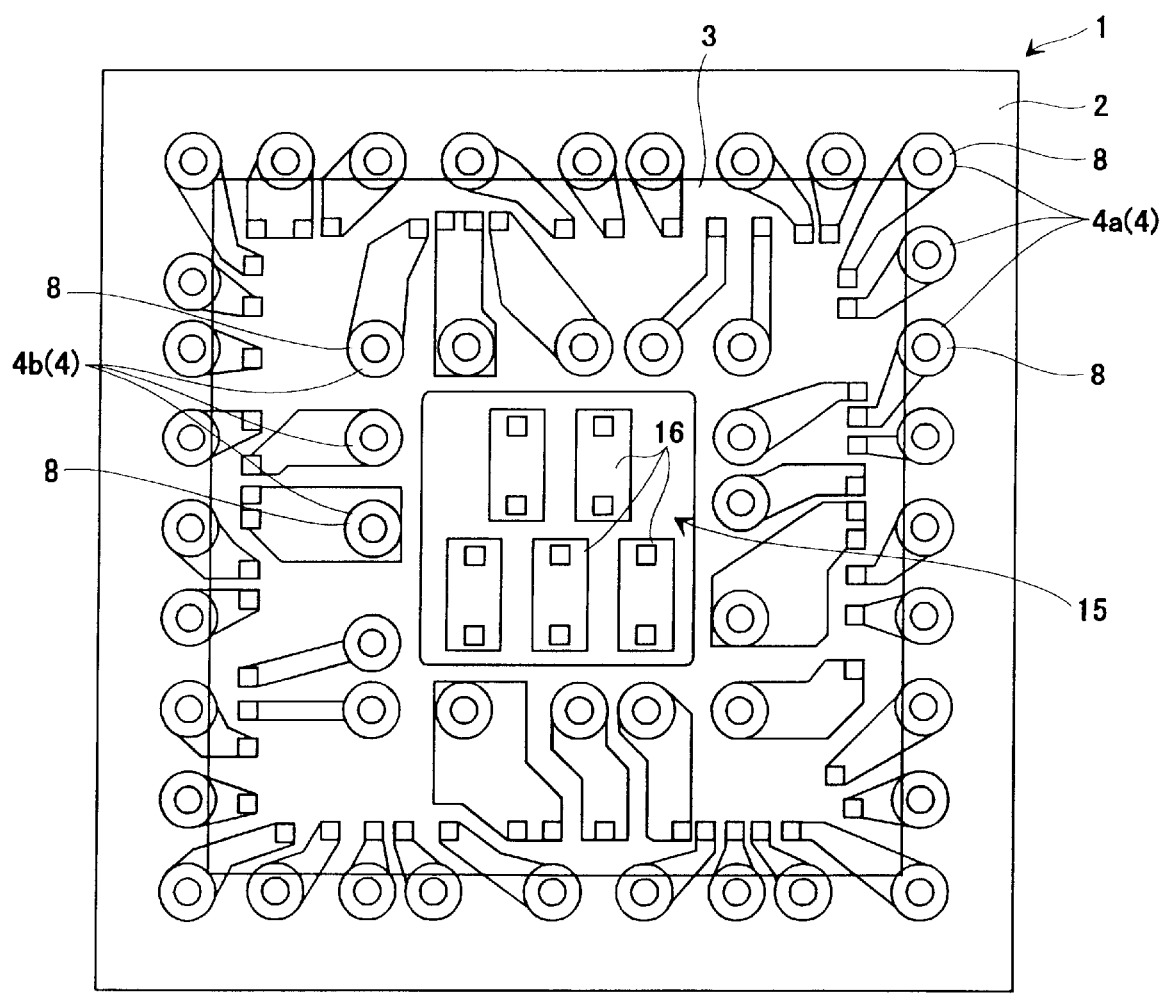
FIG. 5 is a typical illustration showing the relation among a wiring board, signal terminals and power terminals mounted to the wiring board, an opening defined in the wiring board, a semiconductor chip, and capacitors placed on the semiconductor chip, which are employed in the semiconductor device according to the present embodiment 1.

FIG. 5 is a typical illustration showing the relation among the wiring board 2, signal terminals 4a and power terminals 4b provided over the wiring board 2, opening 15 defined in the wiring board 2, semiconductor chip 3, and capacitors 16 placed on the semiconductor chip 3.

Figure 11:
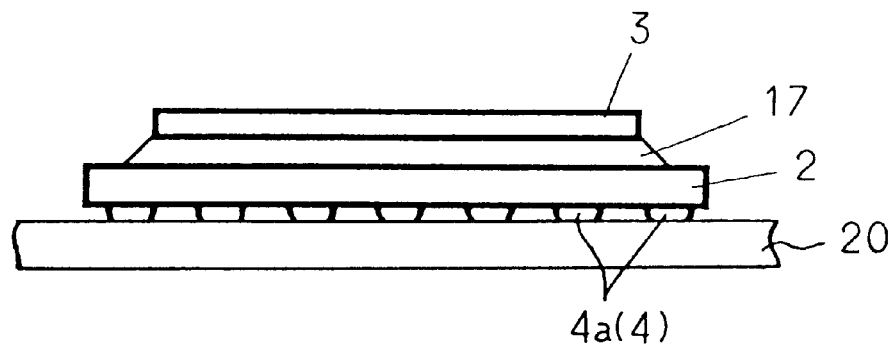
FIG. 11 is a partly front view depicting the state of mounting of the semiconductor device according to the present embodiment 1.

The semiconductor device 1 according to the present embodiment 1 is implemented over a wiring board (motherboard) 20 for a portable cellular phone, for example. FIG. 11 is a front view showing the state of mounting of the semiconductor device 1, FIG. 12 is a partly enlarged cross-sectional view thereof, and FIG. 13 is a typical plan view showing the correlation between bumps 4 provided over a wiring board 2 which constitutes the semiconductor device 1 in the implemented state of the semiconductor device 1, and through holes or the like defined in the wiring board (motherboard) for the portable cellular phone.

Figure 12:
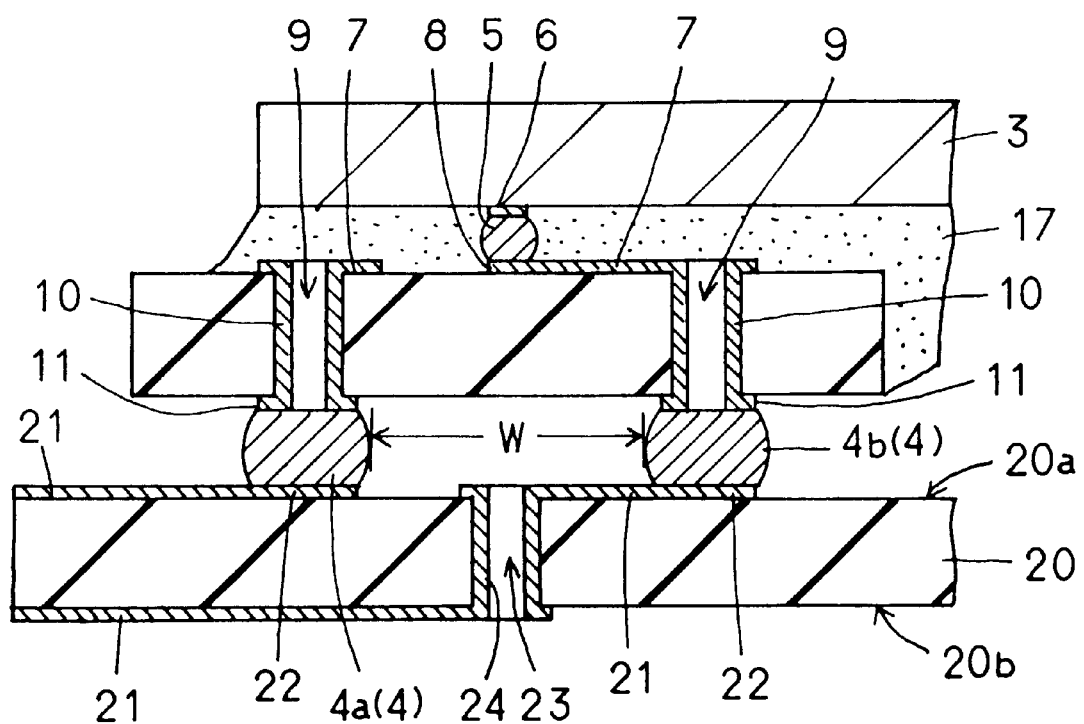
FIG. 12 is a partly typical cross-sectional view showing the state of mounting of the semiconductor device according to the present embodiment 1.
Figure 13:
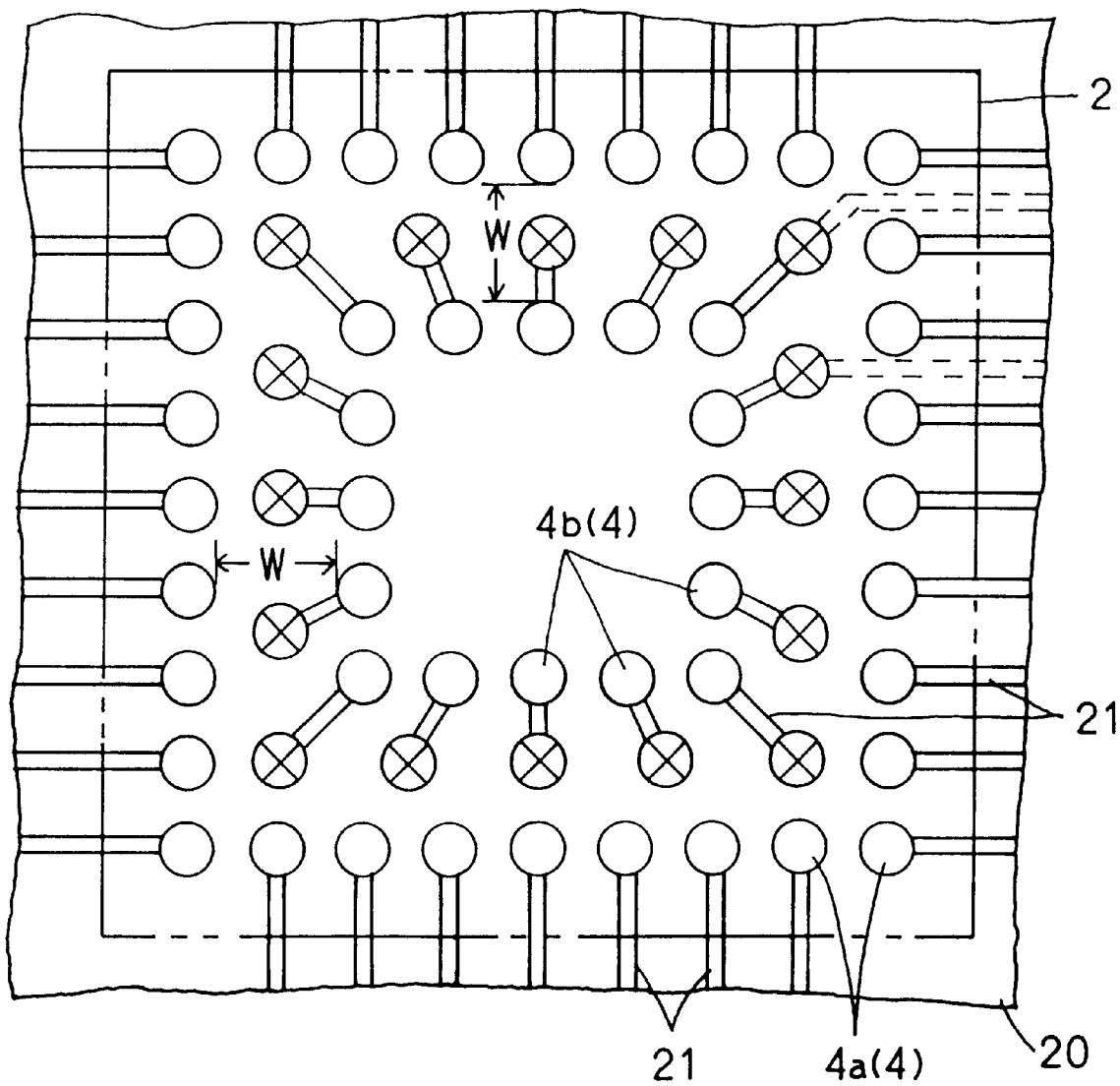
FIG. 13 is a typical plan view illustrating the correlation between bumps mounted to the wiring board which constitutes the semiconductor device according to the present embodiment 1 and through holes or the like provided within a motherboard for a portable cellular phone.

As shown in FIG. 12, wires or interconnections 21 are provided over a mounting surface 20b of the wiring board (motherboard) 20 for the portable cellular phone, on which the semiconductor device 1 is placed, and a reverse side or back 20b of the wiring board 20. Some of the wires 21 respectively form bump fixing pads 22 to which the bumps 4 of the semiconductor device 1 are fixed.

Further, the motherboard 20 has through holes 23 provided so as to cross the wires 21 placed over the front and back thereof. Conductors 24 are provided over the surfaces of the through holes 23 by plating or the like. Thus, the wires 21 placed over the front and back of the motherboard 20 are electrically connected to one another by the conductors 24. The through holes 23 are provided so as to be opposed to the space area W on the second main surface 2b of the wiring board 2 for the semiconductor device 1.

As a result, the inner power terminals 4b (4) of the semiconductor device 1 are electrically connected to the wires 21 on the mounting surface 20b of the motherboard 20, the conductors 24 placed on the through holes 23, and the wires 21 on the back 20b. Therefore, the wires 21 on the back 20b of the motherboard 20 can be extended outside from the outer signal terminals 4a (4) to draw the wires outside from the row of the outer signal terminals 4a. Thus, this can cope with the case where the pitch of each signal terminal 4a is narrow and the wires cannot be formed so as to pass between the signal terminals 4a. Now consider where the diameters of the bump 4 and through hole 23 are set identical to each other as $\underline{a}$ (e.g., a=0.3mm), and a bump pitch $\underline{b}$ (e.g., b=2a=0.5 mm). In this case, the pitch of each bump placed in the inner row and the pitch of each bump placed in the outer row result in $\underline{c}$ (e.g., c=2b=1.0 mm), and the space area W results in 0.7 mm.

Incidentally, the wires drawn outside from the outer signal terminals 4a may be drawn to the mounting surface 20b of the motherboard 20 again owing to the provision of through holes. This can freely be selected according to wiring design.

A functional configuration of the digital cellular type portable telephone in which the semiconductor device 1 according to the present embodiment 1 is built, will now be described with reference to FIG. 14.

A transmission system from a baseband unit 50 to an antenna switch 60 comprises, for example, a quadrature modulator 51 with a signal (I, Q) sent from the baseband unit 50 being set as an input signal, a phase comparator 52, a voltage-controlled oscillator (VCO) 53, and a power amplifier (PA) 54.

Further, a reception system from the antenna switch 60 to the baseband unit 50 comprises, for example, a low noise amplifier (LNA) 61, a first mixer 62, a second mixer 63, an automatic gain controller (AGC) 64, and a quadrature modulator 65 for outputting a signal (I,Q) to the baseband unit 50.

A RFVCO 74 is controlled by a first synthesizer (PLL1) 72 of a dual synthesizer (offset synthesizer) 71 which inputs or receives a signal having a frequency defined as the reference from a temperature compensating crystal oscillator (TCXO) 70. A signal outputted from the RFVCO 74 is inputted to the first mixer 62. Further, a signal outputted from the first synthesizer (PLL1) 72 is inputted to a third mixer 75. A signal outputted from the voltage-controlled oscillator (VCO) 53 is also inputted to the third mixer 75. A signal outputted from the third mixer 75 is inputted to the phase comparator 52.

An IFVCO 76 is controlled by a second synthesizer (PLL2) 73 of the dual synthesizer 71. A signal outputted from the IFVCO 76 is outputted to a frequency divider 77. The frequency divider 77 inputs signals to the quadrature modulator 51 of the transmission system and the quadrature modulator 65 and second mixer 63 of the reception system respectively.

A speaker 91, a microphone 92, and a key control unit 93, etc. are connected to the baseband unit 50.

Further, an antenna 80 is connected to the antenna switch 60.

In the reception system employed in such a portable cellular phone, a signal received by the antenna 80 is inputted to the low noise amplifier (LNA) 61 through the antenna switch 60. The signal amplified by the low noise amplifier 61 is frequency-converted into an intermediate frequency by the first mixer 62 based on the signal outputted from the RFVCO 74.

The signal outputted from the first mixer 62 is frequency-converted by the second mixer 63 again based on the signal outputted from the frequency divider 77. At this time, the RFVCO 74 and the IFVCO 76 for sending the output signal to the frequency divider 77 are controlled by the first synthesizer (PLL1) 72 and the second synthesizer (PLL2) 73 respectively.

The output signal of the second mixer 63 is gain-controlled by the automatic gain controller (AGC) 64 and demodulated by the quadrature modulator 65 in response to the output signal of the frequency divider 77, whereby an I/Q signal is obtained. The I/Q signal is outputted to the baseband unit 50 and radiated from the speaker 91 as a sound signal.

In the transmission system, the sound signal inputted from the microphone 92 is changed to an I/Q signal by the baseband unit 50 and outputted to the quadrature modulator 51. The quadrature modulator 51 modulates the I/Q signal, based on the output signal of the frequency divider 77.

The phase comparator 52 compares the phase of a signal outputted from the quadrature modulator 51 and that of a signal outputted from the third mixer 75 and outputs a signal for controlling the VCO 53 according to the difference in phase therebetween. A signal outputted from the VCO 53 is sent to the third mixer 75 as well as to the power amplifier 54, where it is frequency-converted into an intermediate frequency to be compared in phase by the phase comparator 52. Thus, the output signal of the VCO 53 is modulated based on the I/Q signal of the baseband unit 50, whereby a transmitting signal is obtained.

The power amplifier 54 amplifies the output of the VCO 53. The output signal of the power amplifier 54 is radiated from the antenna 80 as radio waves by performing switching to the antenna switch 60.

Figure 14:
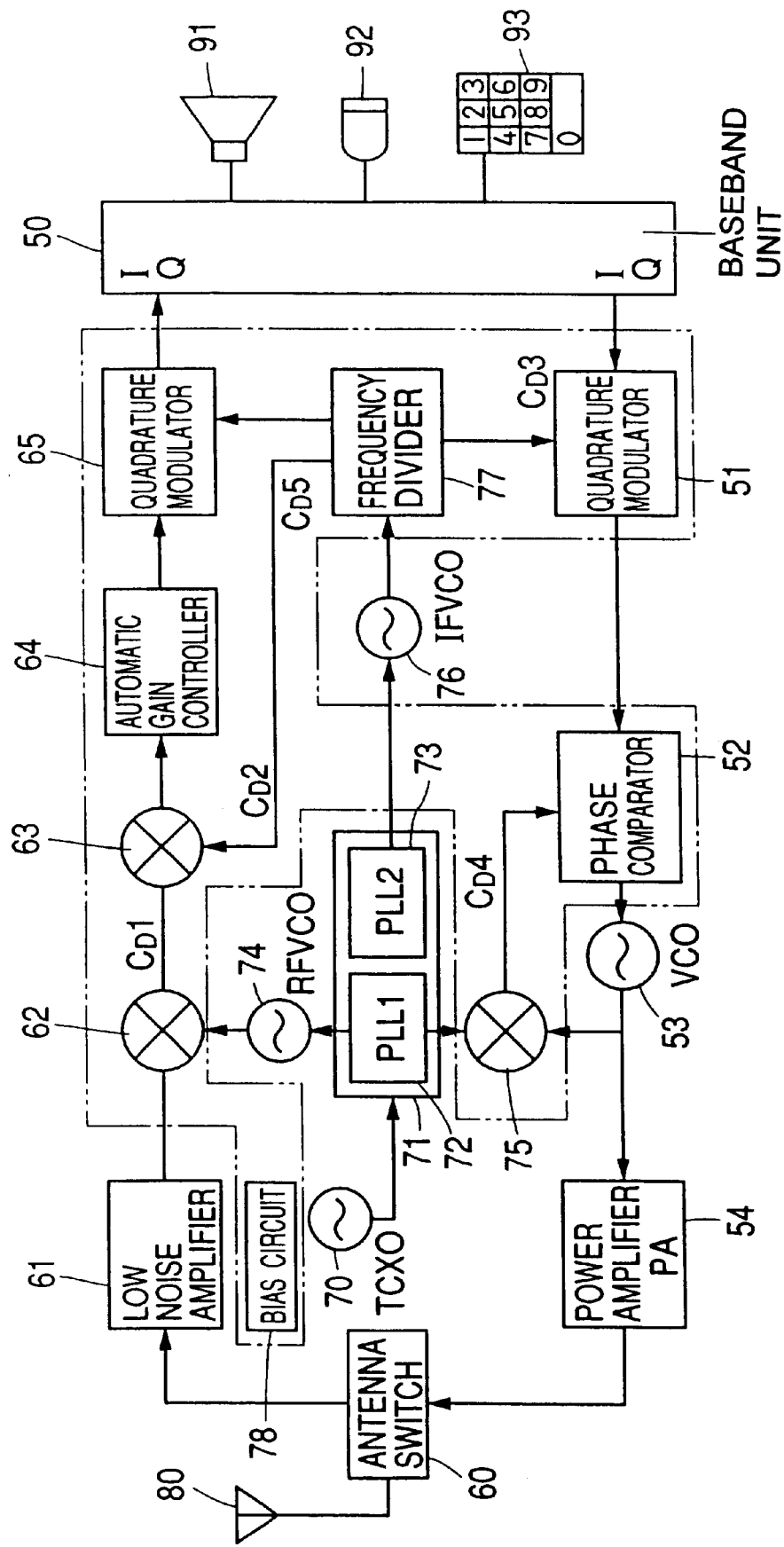
FIG. 14 is a block diagram showing the relationship of mounting between a system configuration of a portable cellular phone in which the semiconductor device according to the present embodiment 1 is built, and power decoupling capacitors.

In the semiconductor device 1 according to the present embodiment 1, a portion given by a frame indicated by a two-dot chain line in FIG. 14, i.e., the quadrature modulator 51, phase comparator 52, offset synthesizer 71, first mixer 62, second mixer 63, third mixer 75, automatic gain controller (AGC) 64, quadrature modulator 65 and frequency divider 77 are monolithically formed over the semiconductor chip 3. A bias circuit 78 for controlling the low noise amplifier (LNA) 61 is also monolithically built in the semiconductor chip 3.

Figure 8:
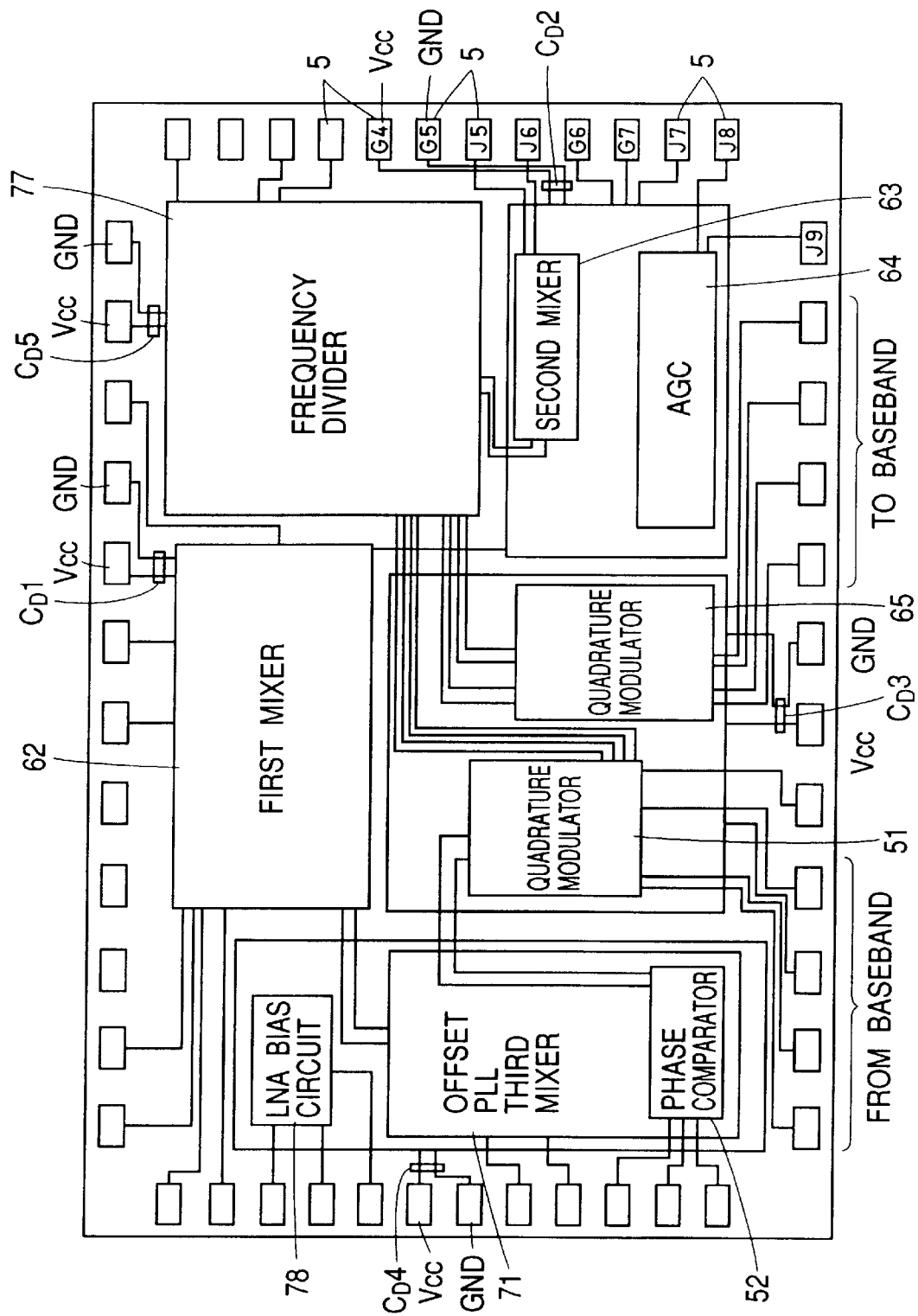
FIG. 8 is a typical illustration depicting the relationship among respective circuit parts, electrodes and power coupling capacitors provided over the semiconductor chip employed in the present embodiment 1.

FIG. 8 is a typical illustration showing respective functional blocks for the semiconductor chip 3. Square portions arranged along the periphery of the semiconductor chip 3 correspond to bumps 5 respectively.

Incidentally, the low noise amplifier (LNA) 61 can also be incorporated monolithically into the semiconductor chip 3.

In FIG. 8, capacitors 16 are incorporated into the functional blocks as follows. A capacitor CD1 is built in the first mixer 62, a capacitor $C_D2$ is built in the second mixer 63 and the automatic gain controller (AGC) 64, a capacitor $C_D3$ is built in the quadrature modulators 51 and 65 of the transmission and reception systems, a capacitor $C_D4$ is built in the offset synthesizer 71, and a capacitor $C_D5$ is built in the frequency divider 77, respectively.

The bumps 5 provided over the main surface of the semiconductor chip 3 take such an arrangement as shown in FIG. 6 as described above. The ten bumps 5 corresponding to the sum of five pairs×two bumps are provided in the central portion of the main surface of the semiconductor chip 3 to place the five capacitors 16 in the central portion thereof. Further, the forty-eight bumps 5 are placed side by side along the periphery of the semiconductor chip 3.

The capacitors 16 are incorporated into a ground wiring unit and a power wiring unit and serve as power decoupling capacitors for reducing switching noise. The state of placement of the capacitors 16 is shown in FIGS. 4 and 7.

FIG. 4 shows the relationship between the capacitor $C_D2$ and the bumps 4 (corresponding to the signal terminals 4a and the power terminals 4b) provided over the second main surface 2b of the wiring board 2 in particular. The power terminals 4b indicate G4 through G7 respectively, and the signal terminals 4a indicate J5 through J9 respectively. An arrangement of these terminals corresponds to the arrangement of the bumps 5, which is shown at a lower-right portion of FIG. 8 in the case of the semiconductor chip 3.

Capacitors $C_d1$ through $C_D5$ are shown even in FIG. 8. The positions of these capacitors $C_D1$ through $C_D5$ are those shown for convenience to understand the relation between their positions and the circuit respective parts. In practice, wires connected to Vcc and GND of the bumps 5 placed along the peripheral edge of the semiconductor chip 3 are drawn to the center side of the semiconductor chip 3. Further, the leading ends of the wires serve as the bumps 5 connected to their corresponding electrodes of the capacitors. The respective capacitors $C_D1$ through $C_{D5}$ are placed on their corresponding center positions of the semiconductor chip 3 as shown in FIGS. 4 and 7.

A method of manufacturing the semiconductor device 1 will next be explained.

Figure 15:
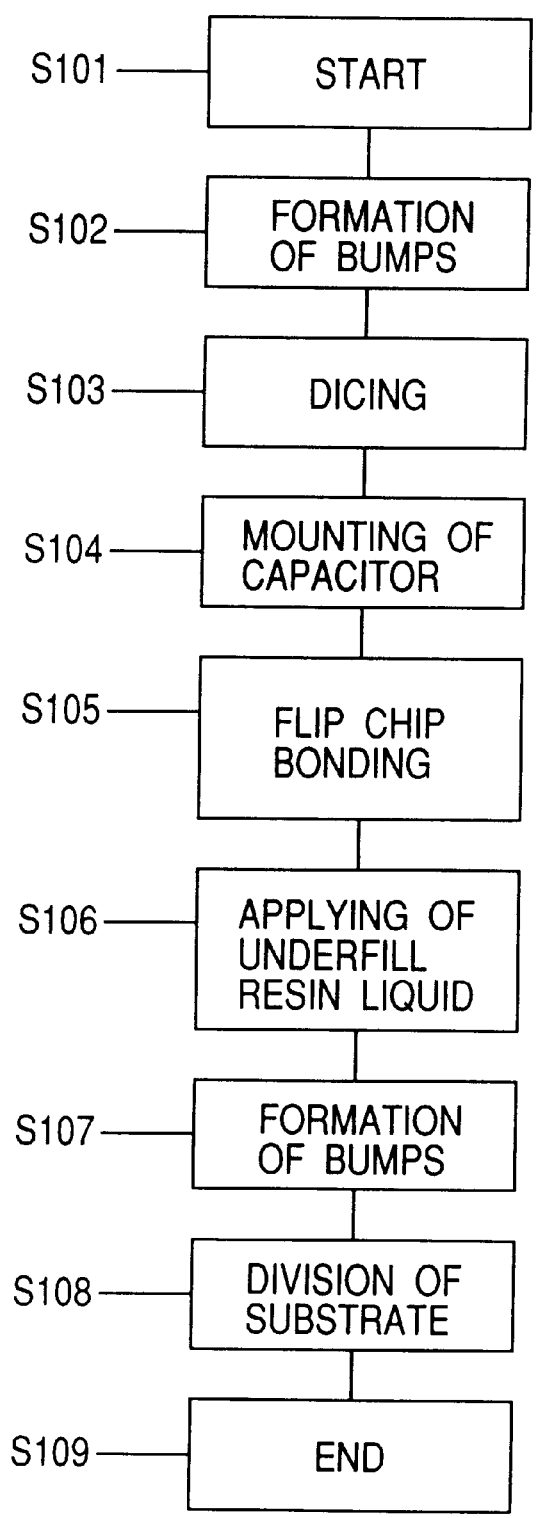
FIG. 15 is a flowchart illustrating a method of manufacturing the semiconductor device according to the present embodiment 1.

The semiconductor device 1 according to the present embodiment 1 is manufactured through respective process steps comprising a work start [Step (S) 101], bump formation [S102], dicing [S103], capacitor loading [S104], flip chip bonding [S105], underfill resin application [S106], bump formation [S107], wiring board division [S108], and work end [S109] as indicated by a flowchart of FIG. 15.

These respective process steps will be explained below.

Figure 16:
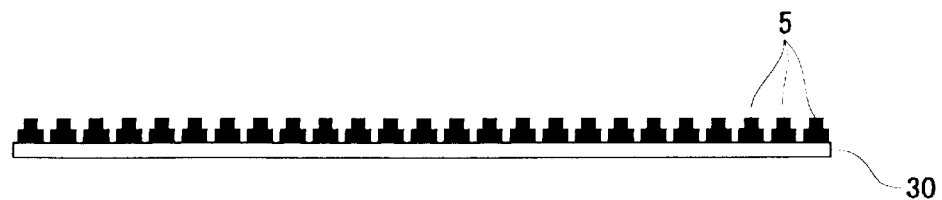
FIG. 16 is a typical illustration depicting a semiconductor substrate on which bumps are formed upon manufacture of the semiconductor device according to the present embodiment 1.

As shown in FIG. 16, a semiconductor substrate 30 in which the formation of each high-frequency unit analog signal processing unit IC has been completed, is prepared. Afterwards, bumps 5 are formed thereon. The ICs are formed in line over the semiconductor substrate 30 in every direction, and the bumps 5 are formed over the surface of each IC as shown in FIG. 6.

Figure 17:
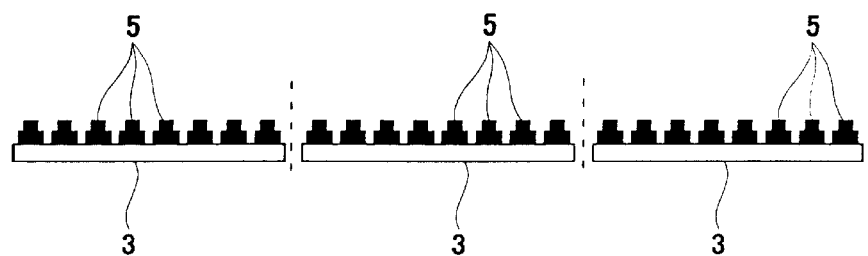
FIG. 17 is a typical illustration showing a state in which the semiconductor substrate is diced upon manufacture of the semiconductor device according to the present embodiment 1 to form semiconductor chips.

Although not shown in the drawing, a dicing device is next used to dice the semiconductor substrate 30 and thereby divide it, whereby a plurality of semiconductor chips 3 are formed as shown in FIG. 17.

Figure 18:
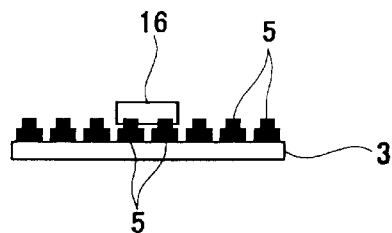
FIG. 18 is a typical illustration showing a state in which power decoupling capacitors are placed over each semiconductor chip upon manufacture of the semiconductor device according to the present embodiment 1.

Next, as shown in FIG. 18, power decoupling capacitors 16 are placed over each semiconductor chip 3. The five capacitors 16 are placed over the semiconductor chip 3 as shown in FIG. 7.

Figure 19:
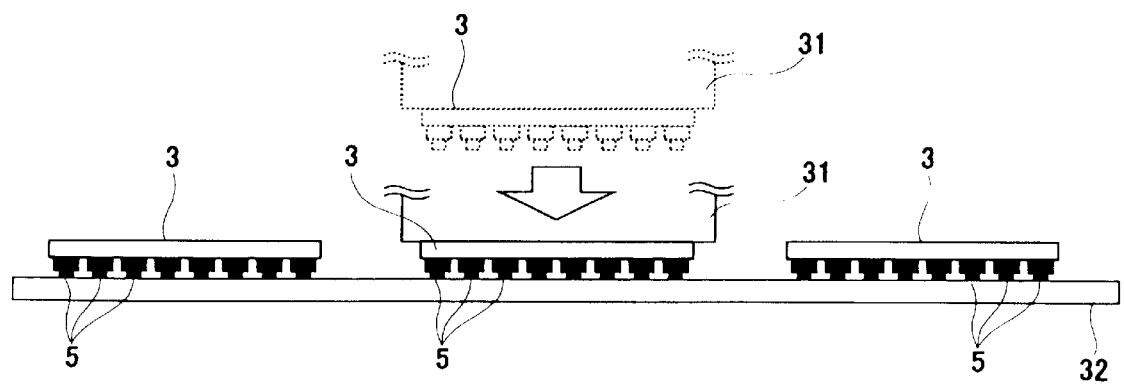
FIG. 19 is a typical illustration depicting a state in which the semiconductor chips are placed over a module substrate base material by flip chip bonding upon manufacture of the semiconductor device according to the present embodiment 1.

Next, as shown in FIG. 19, each of the semiconductor chips 3 is absorbed and held under vacuum at a lower end of a vacuum absorption tool (collet) 31 so that the bumps 5 are turned upside down. In this condition, the semiconductor chips 3 are placed over a wiring board base material 32 one by one by flip chip bonding. Wiring blocks having predetermined wiring patterns formed vertically and horizontally are formed in line over the wiring board base material 32. These wiring blocks are thereafter cut to form the wiring boards 2 shown in FIGS. 9 and 10. Thus, the opening 15 is defined in the central portion of each wiring block.

Figure 20:
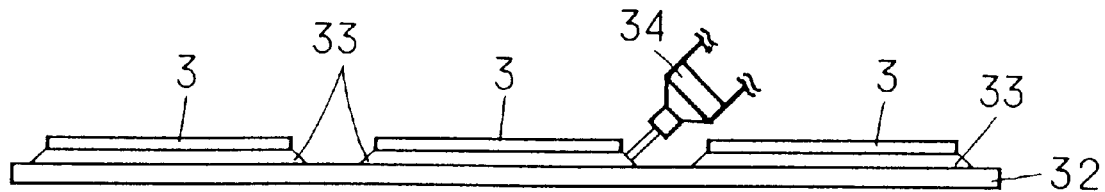
FIG. 20 is a typical illustration showing a state in which a resin is under-fill applied between the semiconductor chips and the module substrate base material upon manufacture of the semiconductor device according to the present embodiment 1.

Next, as shown in FIG. 20, a resin liquid (underfill resin liquid) 33 is charged into clearances or gaps defined between the wiring board base material 32 and the semiconductor chips 3 by an injector 34. At this time, the wiring board base material 32 is turned upside down and the underfill resin liquid may be applied to the main surface side of each semiconductor chip 3 through the opening 15 to charge a resin into the gap between the wiring board base material 32 and each semiconductor chip 3. The resin comprises an epoxy resin, for example and is cured by a heat curing process. Thus, resins (underfill resins) 17 for blocking between the semiconductor chips 3 and the wiring board base material 32 are formed as shown in FIG. 21.

Figure 21:
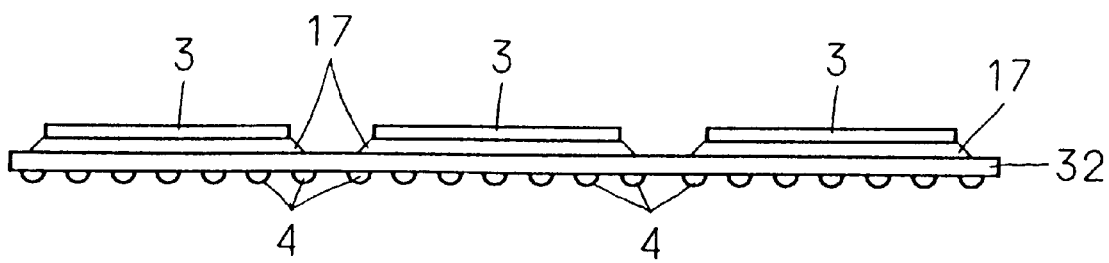
FIG. 21 is a typical illustration showing a state in which ball electrodes are formed over the module substrate base material upon manufacture of the semiconductor device according to the present embodiment 1.

Next, bumps 4 are formed over the back of the wiring board base material 32 as shown in FIG. 21. A method of forming the bumps is considered in various forms. In the present embodiment 1, however, bump materials are printed to predetermined thicknesses by screen printing or the like and thereafter subjected to heat treatment (reflow processing) to thereby form ball-shaped bumps 4 through the use of surface tensions of the bump materials. An arrangement of the bumps 4 is represented as shown in FIG. 10.

Figure 22:
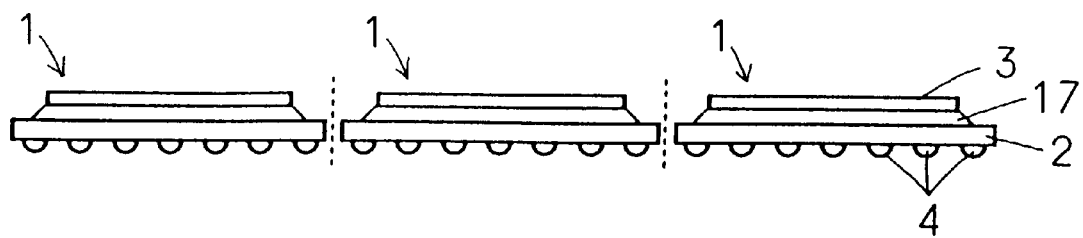
FIG. 22 is a typical illustration depicting a state in which the module substrate base material is divided to form each individual semiconductor devices upon manufacture of the semiconductor device according to the present embodiment 1.

Next, the wiring board base material 32 is divided vertically and horizontally to form a plurality of semiconductor devices 1 as shown in FIG. 22.

According to the present embodiment 1, the following advantageous effects are brought about.

(1) Since power decoupling capacitors 16 are directly placed over a main surface of a semiconductor chip 3, the length of a conductor (wiring) portion lying between each of the capacitors 16 and the semiconductor chip 3 becomes short to thereby allow reductions in resistance and inductance, whereby switching noise can be further reduced.

(2) Since the semiconductor chip 3 having the power decoupling capacitors 16 placed over the main surface thereof is fixed to a wiring board 2 on the main surface side thereof by flip chip bonding, and the wiring board 2 is provided with an opening 15 into which the power decoupling capacitors 16 fixed to the main surface of the semiconductor chip 3 are inserted, a reduction in the thickness of the semiconductor device 1 can be achieved.

(3) A portable cellular phone with the semiconductor device 1 built therein, which provides less switching noise, can be provided because it can achieve a reduction in switching noise. Thus, the state of a call thereof becomes always satisfactory.

(4) Bumps provided over a second main surface 2b of the wiring board 12 are arranged in a double row, and a space area W is provided which allows the provision of one or more rows of terminals (through holes) between the respective rows of bumps. A wiring board (motherboard) 20 with the semiconductor device 1 implemented thereon takes a structure wherein through holes 23 having conductors 24 formed over their surfaces are formed at portions each corresponding to the space area W, and wires or interconnections drawn from the inner row of bumps 4 are drawn to a reverse side or back 20b of the motherboard 20 through the use of the through holes 23 to thereby form drawn wires over the back of the motherboard 20. Thus, since it is not necessary to draw the drawn wires of the inner row of bumps 4 between the outer bumps, the pitch of each of the bumps lying in each bump row can be reduced. As a result, the semiconductor chip and the wiring board can be brought into less size, and the numbers of obtainable semiconductor chips and wiring boards formed of one semiconductor substrate and one wiring board base material increase, whereby the manufacturing cost of each semiconductor device can be reduced. Further, the wiring board (motherboard) with the semiconductor device implemented thereon is also reduced in size and hence a reduction in the cost of an electronic device can also be achieved.

(Embodiment 2)

Figure 23:
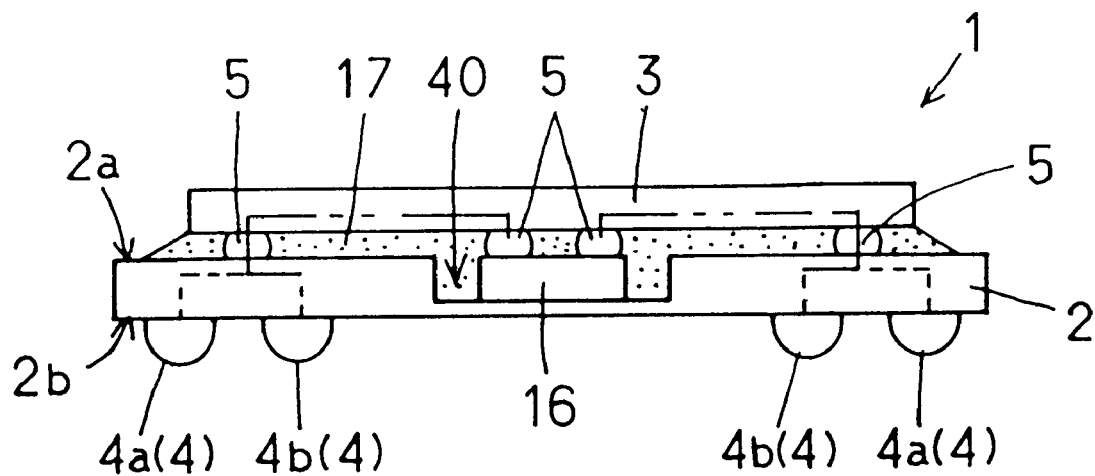
FIG. 23 is a typical cross-sectional view of a semiconductor device showing another embodiment (embodiment 2) of the present invention.

FIG. 23 is a typical cross-sectional view of a semiconductor device showing another embodiment (embodiment 2) of the present invention.

A semiconductor device 1 according to the present embodiment 2 has a structure wherein a recess 40 is defined in a first main surface 2a of a wiring board 2 in the structure employed in the embodiment 1. The recess 40 is provided in place of the opening 15. Five capacitors 16 placed over a main surface of a semiconductor chip 3 are located in this recess. A resin (underfill resin) 17 to be charged between the semiconductor chip 3 and the wiring board 2 is also charged into the recess 40.

The semiconductor device 1 according to the present embodiment 2 can also achieve a reduction in switching noise in a manner similar to the embodiment 1.

(Embodiment 3)

Figure 24:
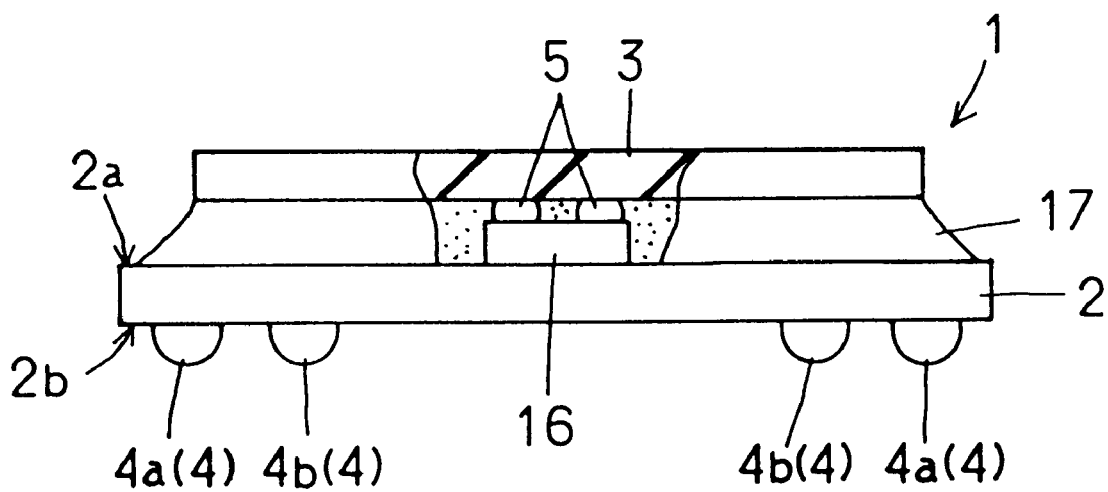
FIG. 24 is a typical front view partly in section of a semiconductor device showing a further embodiment (embodiment 3) of the present invention.

FIG. 24 is a typical front view partly in section of a semiconductor device showing a further embodiment (embodiment 3) of the present invention.

A semiconductor device 1 according to the present embodiment 3 has a structure wherein without providing the opening and recess as in the embodiments referred to above, capacitors 16 are placed over a main surface of a semiconductor chip 3, a surface on which the capacitors 16 are placed, is opposed to a first main surface 2a of a wiring board 2, and the semiconductor chip 3 is implemented over the wiring board 2 with bumps 5 provided over the semiconductor chip 3 interposed therebetween. Thus, the present structure needs to lengthen each bump 5 provided over the semiconductor chip 3 along the direction of its thickness, for example. However, since the semiconductor device 1 takes a structure wherein the power decoupling capacitors 16 are directly placed over the main surface of the semiconductor chip 3 in terms of the characteristics of the semiconductor device 1, the present embodiment can reduce switching noise in a similar to the respective embodiments referred to above.

(Embodiment 4)

Figure 25A:
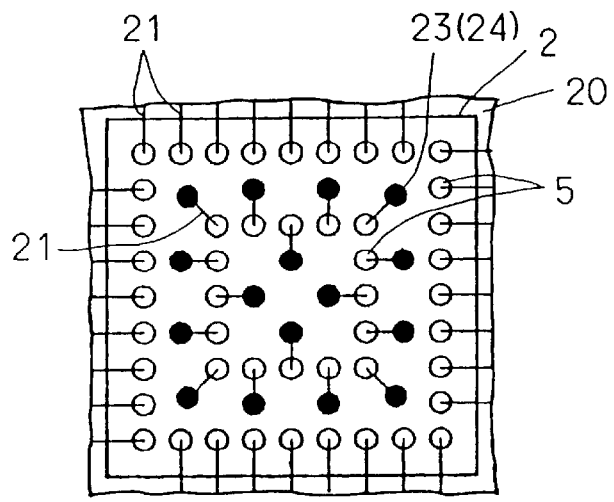
FIGS. 25(a)–25(c) are illustrations showing the relationship of wiring between a module substrate and a printed circuit board used for each semiconductor device illustrative of a still further embodiment (embodiment 4) of the present invention.
Figure 25B:
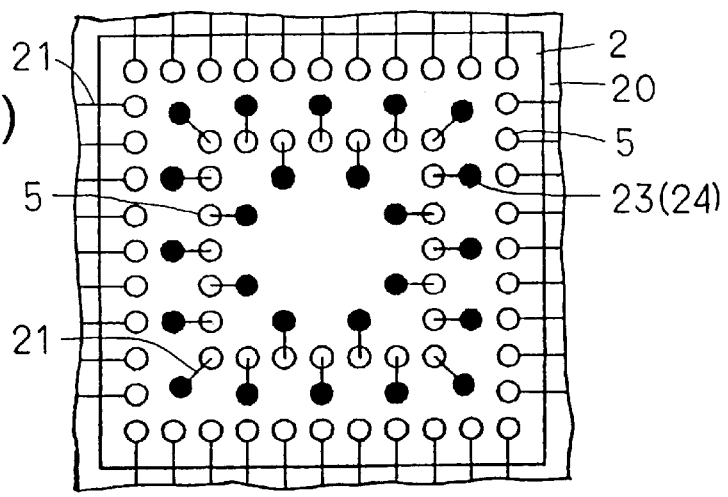
Figure 25C:
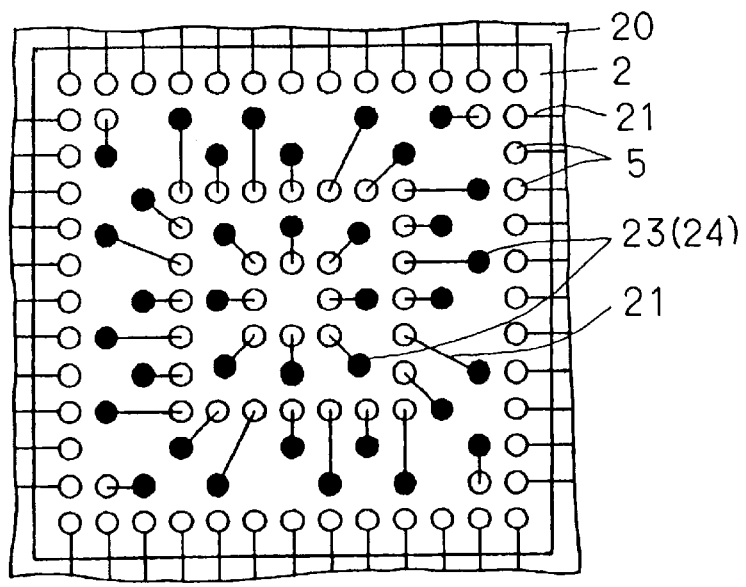

FIGS. 25(a) through 25(c) are respectively typical illustrations showing the relationships of wiring between module substrates and printed circuit boards used for respective semiconductor devices each illustrative of a still further embodiment (embodiment 4) of the present invention.

While these embodiments are explained in a state in which no openings are defined in wiring boards 2, they are similar even in the case where the openings or recesses are defined in the wiring boards 2.

FIG. 25(a) shows an example in which forty-eight bumps 4 are provided over a second main surface of a wiring board 2, FIG. 25(b) illustrates an example in which sixty-four bumps 4 are provided over a second main surface of a wiring board 2, and FIG. 25(c) depicts an example in which eighty-four bumps 4 are provided over a second surface of a wiring board 2, respectively. These bumps 4 are indicated by white circles respectively.

FIGS. 25(a) and 25(b) are respectively examples in which bump rows are rectangularly arranged in double form, and FIG. 25(c) is an example in which bump rows are rectangularly arranged in triple form.

In these drawings, parts indicated by black circles respectively correspond through holes 23 defined in wiring boards (motherboards) 20 on which the semiconductor devices are implemented, and conductors 24 formed over the surfaces of the through holes 23. Lines for connecting the black circles and the white circles, and lines extending outside the outermost white circles are respectively wires or interconnections 21 provided over mounting surfaces on which the semiconductor devices of the wiring boards (motherboards) 20 are placed.

Namely, when the bump rows provided over the second main surface of each wiring board 2 are arranged as a multiple row, a space area, which allows one or more rows of terminals (through holes) to be provided between the respective rows, is provided to thereby eliminate for the need of drawing wires drawn from the inner row of bumps 4 between the bumps on the outer side. It is therefore possible to reduce the pitch of each of the bumps lying in each bump row. As a result, the semiconductor chips and the wiring boards can be brought into less size, and the numbers of obtainable semiconductor chips and wiring boards formed of one semiconductor substrate and one wiring board base material increase, whereby the manufacturing cost of each semiconductor device can be reduced. Further, the wiring board (motherboad) with the semiconductor device implemented thereon is also reduced in size and hence a reduction in the cost of an electronic device can also be achieved.

While the invention made by the present inventors as described above has been described specifically by the embodiments, the present invention is not necessarily limited to the embodiments referred to above. It is needless to say that various changes can be made within the scope not departing from the substance thereof.

Advantageous effects obtained by typical ones of the inventions disclosed in the present application will be described in brief as follows:

(1) Since power decoupling capacitors are directly placed over a main surface of a semiconductor chip, reductions in resistance and inductance can be achieved, whereby switching noise can be further reduced.

(2) Since an opening or recess is defined in a wiring board, and power decoupling capacitors directly placed over a semiconductor chip are placed within the opening or recess, a reduction in the thickness of a semiconductor device can be achieved.

(3) Since each of portable cellular phones with the semiconductor devices of the above (1) and (2) built therein, which provide less switching noise, can be provided or offered because it can achieve a reduction in switching noise. Thus, the state of a call thereof becomes always satisfactory.

(4) An interval between bump rows provided in double form over a wiring substrate surface of a semiconductor device serves as a space area W which allows the provision of one or more rows of terminals (through holes). A wiring board (motherboard) with the semiconductor device implemented thereon takes a structure wherein through holes having conductors formed over their surfaces are formed at portions each corresponding to the space area W of the wiring board (motherboard), and wires or interconnections drawn from the inner row of bumps are drawn to a reverse side or back of the motherboard through the use of the through holes. Thus, since it is not necessary to draw the drawn wires of the inner row of bumps between the outer bumps, the pitch of each bump can be reduced. As a result, the semiconductor chip and the wiring board can be brought into less size, and the numbers of obtainable semiconductor chips and wiring boards formed of one semiconductor substrate and one wiring board base material increase, whereby the manufacturing cost of each semiconductor device can be reduced. Further, the motherboard with the semiconductor device implemented thereon is also reduced in size and hence a reduction in the cost of an electronic device can also be achieved.

INDUSTRIAL APPLICABILITY

As described above, a semiconductor device according to the present invention, in which power decoupling capacitors comprising chip capacitors are built to reduce switching noise, is suitable as a semiconductor device for a radio communication device, such as a portable cellular phone or the like.

What is claimed is:

1. A semiconductor device, comprising:

a wiring board having a plurality of wires;

a semiconductor chip having a plurality of semiconductor elements and a plurality of electrodes provided over a main surface thereof, said semiconductor chip having a main surface placed over a first main surface of said wiring board so as to be opposite to the first main surface; and a plurality of external terminals provided over a second main surface of said wiring board, which is opposite to the first main surface thereof; and wherein said plurality of external terminals have a plurality of signal terminals and a plurality of power terminals, said plurality of signal terminals are arranged along the periphery of said wiring board, said plurality of power terminals are arranged along the inside of a row comprising said plurality of signal terminals, chip capacitors are placed over the main surface of said semiconductor chip, corresponding to an area lying inside a row comprising said plurality of power terminals, the plurality of electrodes of said semiconductor chip and the plurality of signal terminals and power terminals are connected to one another by the plurality of wires formed over said wiring board.

2. The semiconductor device according to claim 1, wherein electrodes of said chip capacitors are respectively connected to the electrodes of said semiconductor chip with bumps interposed therebetween.

3. The semiconductor device according to claim 1 or 2, wherein the plurality of electrodes of said semiconductor chip are placed over the first main surface of said wiring board, which corresponds to an area provided between the row comprising the plurality of signal terminals and the row comprising the plurality of power terminals.

4. The semiconductor device according to claim 3, wherein the area formed between the row of the signal terminals and the row of the power terminals is provided with a space area which allows the provision of one or more rows of the terminals.

5. A semiconductor device, comprising:

a wiring board having a plurality of wires;

a semiconductor chip having a plurality of semiconductor elements and a plurality of electrodes provided over a main surface thereof, said semiconductor chip having a main surface placed over a first main surface of said wiring board so as to be opposite to the first main surface; and a plurality of external terminals provided over a second main surface of said wiring board, which is opposite to the first main surface thereof; and wherein said plurality of external terminals have a plurality of signal terminals and a plurality of power terminals, said plurality of signal terminals are arranged along the periphery of said wiring board, said plurality of power terminals are arranged along the inside of a row comprising said plurality of signal terminals, chip capacitors are placed over the main surface of said semiconductor chip, corresponding to an area lying inside a row comprising said plurality of power terminals, the plurality of electrodes of said semiconductor chip and the plurality of signal terminals and power terminals are connected to one another by the plurality of wires formed over said wiring board, said wiring board is provided with an opening or recess which extends therethrough, and said chip capacitors are positioned within the opening or recess.

6. The semiconductor device according to claim 5, wherein bumps for connecting the electrodes of said chip capacitors and the electrodes of said wiring board, and bumps for connecting the electrodes of said wiring board and the electrodes of said semiconductor chip are simultaneously provided respectively.

7. The semiconductor device according to claim 5 or 6, wherein the electrodes of said semiconductor chip are placed between the signal terminals and the power terminals.

8. The semiconductor device according to claims 5 or 6, wherein a space area, which allows the provision of one or more rows of the signal terminals and/or the power terminals, is provided between the row of the signal terminals and the row of the power terminals.

9. An electronic device, comprising:

a semiconductor device including, a wiring board having a plurality of wires;

a semiconductor chip having a plurality of semiconductor elements and a plurality of electrodes provided over a main surface thereof, said semiconductor chip having a main surface placed over a first main surface of said wiring board so as to be opposite to the first main surface; and a plurality of external terminals provided over a second main surface of said wiring board, which is opposite to the first main surface thereof; and wherein said plurality of external terminals have a plurality of signal terminals and a plurality of power terminals, said plurality of signal terminals are arranged along the periphery of said wiring board, said plurality of power terminals are arranged along the inside of a row comprising said plurality of signal terminals, chip capacitors are placed over the main surface of said semiconductor chip, corresponding to an area lying inside a row comprising said plurality of power terminals, the plurality of electrodes of said semiconductor chip and the plurality of signal terminals and power terminals are connected to one another by the plurality of wires formed over said wiring board; and a wiring board which places the semiconductor device thereon.

10. An electronic device, comprising:

a semiconductor device including, a wiring board having a plurality of wires;

a semiconductor chip having a plurality of semiconductor elements and a plurality of electrodes provided over a main surface thereof, said semiconductor chip having a main surface placed over a first main surface of said wiring board so as to be opposite to the first main surface; and a plurality of external terminals provided over a second main surface of said wiring board, which is opposite to the first main surface thereof; and wherein said plurality of external terminals have a plurality of signal terminals and a plurality of power terminals, said plurality of signal terminals are arranged along the periphery of said wiring board, said plurality of power terminals are arranged along the inside of a row comprising said plurality of signal terminals, chip capacitors are placed over the main surface of said semiconductor chip, corresponding to an area lying inside a row comprising said plurality of power terminals, the plurality of electrodes of said semiconductor chip and the plurality of signal terminals and power terminals are connected to one another by the plurality of wires formed over said wiring board, said wiring board is provided with an opening or recess which extends therethrough, and said chip capacitors are positioned within the opening or recess; and a wiring board which places the semiconductor device thereon.

11. The electronic device according to claim 9 or 10, wherein through conductors are provided at portions of said semiconductor device, with which a space area of said wiring board with said semiconductor device attached thereto is faced, and wires drawn for the power terminals are introduced into the reverse side of said wiring board via the through conductors and drawn outside the row of the signal terminals.

12. The electronic device according to claim 9 or 10, wherein said semiconductor device constitutes an integrated circuit built in a radio communication device.

13. The semiconductor device according to claim 7, wherein a space area, which allows the provision of one or more rows of the signal terminals and/or the power terminals, is provided between the row of the signal terminals and the row of the power terminals.

14. The electronic device according to claim 11, wherein said semiconductor device constitutes an integrated circuit built in a radio communication device.

* * * * *